(12) United States Patent
Lavoie et al.

(10) Patent No.: US 8,513,122 B2
(45) Date of Patent: Aug. 20, 2013

(54) METHOD AND STRUCTURE FOR DIFFERENTIAL SILICIDE AND RECESSED OR RAISED SOURCE/DRAIN TO IMPROVE FIELD EFFECT TRANSISTOR

(71) Applicant: International Business Machines Corporation, Armonk, NY (US)

(72) Inventors: Christian Lavoie, Pleasantville, NY (US); Viorel C. Ontalus, Danbury, CT (US); Ahmet S. Ozcan, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/759,146

(22) Filed: Feb. 5, 2013

(65) Prior Publication Data

US 2013/0149865 A1    Jun. 13, 2013

Related U.S. Application Data

(62) Division of application No. 12/560,585, filed on Sep. 16, 2009.

(51) Int. Cl.
*H01L 27/092* (2006.01)
*H01L 21/8238* (2006.01)

(52) U.S. Cl.
USPC ........... 438/682; 257/204; 257/369; 257/382; 257/384; 257/576; 257/371; 257/377; 257/E23.157; 257/E21.636; 257/E21.064; 438/584

(58) Field of Classification Search
USPC ................ 257/204, 369, 371, 377, 382, 384, 257/576, E21.636, E27.062, E27.064; 438/584, 438/682
See application file for complete search history.

(56) References Cited

U.S. PATENT DOCUMENTS

| | | | |
|---|---|---|---|
| 4,473,074 A | 9/1984 | Vassiliadis | |
| 6,303,057 B1 | 10/2001 | Stickley et al. | |
| 6,380,024 B1 | 4/2002 | Liaw | |
| 6,391,767 B1 | 5/2002 | Huster et al. | |
| 6,815,317 B2 | 11/2004 | Schafbauer et al. | |
| 6,974,737 B2 | 12/2005 | Snyder et al. | |

(Continued)

OTHER PUBLICATIONS

U.S. Appl. No. 13/560,585, filed Sep. 16, 2009, IBM, Notice of Allowance Communication, Mar. 6, 2013, 11 pages.

(Continued)

*Primary Examiner* — Matthew W Such
*Assistant Examiner* — David Spalla
(74) *Attorney, Agent, or Firm* — Gibb & Riley, LLC; Yuanmin Cai, Esq.

(57) ABSTRACT

A method forms an integrated circuit structure. The method patterns a protective layer over a first-type field effect transistor and removes a stress liner from above a second-type field effect transistors. Then, the method removes a first-type silicide layer from source and drain regions of the second-type field effect transistor, but leaves at least a portion of the first-type silicide layer on the gate conductor of the second-type field effect transistor. The method forms a second-type silicide layer on the gate conductor and the source and drain regions of the second-type field effect transistor. The second-type silicide layer that is formed is different than the first-type silicide layer. For example, the first-type silicide layer and the second-type silicide layer can comprise different materials, different thicknesses, different crystal orientations, and/or different chemical phases, etc.

15 Claims, 6 Drawing Sheets

(56) References Cited

U.S. PATENT DOCUMENTS

| | | |
|---|---|---|
| 6,987,061 B2 | 1/2006 | Mehrotra |
| 7,235,473 B2 | 6/2007 | Jawarani et al. |
| 7,247,547 B2 | 7/2007 | Zhu et al. |
| 7,273,777 B2 | 9/2007 | Biery et al. |
| 7,355,253 B2 | 4/2008 | Cohen |
| 7,479,684 B2 | 1/2009 | Guha et al. |
| 8,039,284 B2 | 10/2011 | Ke et al. |
| 8,084,827 B2 | 12/2011 | Bulucea et al. |
| 2009/0197381 A1* | 8/2009 | Lenski et al. ............ 438/278 |
| 2009/0273035 A1* | 11/2009 | Frohberg et al. ............ 257/369 |
| 2010/0173465 A1* | 7/2010 | Kamei et al. ............ 438/299 |

OTHER PUBLICATIONS

Office Action Communication, U.S. Appl. No. 12/560,585 dated Apr. 3, 2012, pp. 1-6.
Office Action Communication, U.S. Appl. No. 12/560,585 dated May 9, 2012, pp. 1-10.
Notice of Allowance Office Action Communication, U.S. Appl. No. 12/560,585 dated Dec. 24, 2012, 1-8.

* cited by examiner

METHOD AND STRUCTURE FOR DIFFERENTIAL SILICIDE AND RECESSED OR RAISED SOURCE/DRAIN TO IMPROVE FIELD EFFECT TRANSISTOR

CROSS-REFERENCE TO RELATED APPLICATIONS

The present invention claims the benefit under 35 U.S.C. §120 as a division of U.S. application Ser. No. 12/560,585 filed Sep. 16, 2009, the complete disclosure of which, in its entirety, is herein incorporated by reference.

BACKGROUND OF THE INVENTION

1. Field of the Invention

The invention generally relates to integrated circuit structures and more particularly relates to complimentary transistors that utilize differently silicide and recessed source and drain regions to improve transistor performance.

2. Description of Related Art

Conventional processes continually refine the ability of manufacturers to create smaller and higher performance transistors. However, such conventional processing forms silicide regions over transistor structures that are identical irrespective of the type of transistor. The embodiments described below break away from such conventional teachings by providing methods and structures that utilized differently silicided and recessed source and drain regions to improve transistor performance.

BRIEF SUMMARY OF THE INVENTION

One embodiment herein comprises an integrated circuit structure comprising: a substrate; at least one first-type field effect transistor partially within the substrate; and at least one second-type field effect transistor partially within the substrate, the first-type field effect transistor comprising first-type source and drain regions within the substrate, a first-type channel region within the substrate between the first-type source and drain regions, a first-type gate conductor adjacent the first-type channel region, a first-type gate insulator between the first-type channel region and the first-type gate conductor, and a first-type silicide layer on the first-type source and drain regions, the second-type field effect transistor comprising second-type source and drain regions within the substrate, a second-type channel region within the substrate between the second-type source and drain regions, a second-type gate conductor adjacent the second-type channel region, and a second-type gate insulator between the second-type channel region and the second-type gate conductor, and a second-type silicide layer on the second-type source and drain regions, and the first-type silicide layer being different than the second-type silicide layer.

Another embodiment comprises an integrated circuit structure comprising: a substrate; at least one first-type field effect transistor partially within the substrate; and at least one second-type field effect transistor partially within the substrate, the first-type field effect transistor comprising first-type source and drain regions within the substrate, a first-type channel region within the substrate between the first-type source and drain regions, a first-type gate conductor adjacent the first-type channel region, a first-type gate insulator between the first-type channel region and the first-type gate conductor, and a first-type silicide layer on the first-type source and drain regions, the second-type field effect transistor comprising second-type source and drain regions within the substrate, a second-type channel region within the substrate between the second-type source and drain regions, a second-type gate conductor adjacent the second-type channel region, and a second-type gate insulator between the second-type channel region and the second-type gate conductor, a second-type silicide layer on the second-type source and drain regions, and the first-type silicide layer on the second-type gate conductor, the first-type silicide layer being different than the second-type silicide layer, and the first-type field effect transistor comprising an opposite polarity transistor relative to the second-type field effect transistor.

Another embodiment comprises a method of altering an integrated circuit structure, the method comprising: supplying an integrated circuit structure comprising at least one first-type field effect transistor and at least one second-type field effect transistor, the first-type field effect transistor and the second-type field effect transistor each comprising source and drain regions, a channel region between the source and drain regions, a gate conductor adjacent the channel region, a gate insulator between the channel region and the gate conductor, and a first-type silicide layer on the gate conductor and the source and drain regions; patterning a protective layer over the first-type field effect transistor; removing at least a portion of the first-type silicide layer from the second-type field effect transistor; and forming a second-type silicide layer on the gate conductor and the source and drain regions of the second-type field effect transistor, the second-type silicide layer being different than the first-type silicide layer.

Another embodiment comprises a method of altering an integrated circuit structure, the method comprising: supplying an integrated circuit structure comprising at least one first-type field effect transistor and at least one second-type field effect transistor, the first-type field effect transistor and the second-type field effect transistor each comprising source and drain regions, a channel region between the source and drain regions, a gate conductor adjacent the channel region, a gate insulator between the channel region and the gate conductor, and a first-type silicide layer on the gate conductor and the source and drain regions, the first-type silicide layer being thicker in regions over the gate conductor relative to regions over the source and drain regions; patterning a protective layer over the first-type field effect transistor; removing the first-type silicide layer from the source and drain regions of the second-type field effect transistor and leaving at least a portion of the first-type silicide layer on the gate conductor of the second-type field effect transistor; and forming a second-type silicide layer on the gate conductor and the source and drain regions of the second-type field effect transistor, the second-type silicide layer being different than the first-type silicide layer.

DETAILED DESCRIPTION

Figure 1:
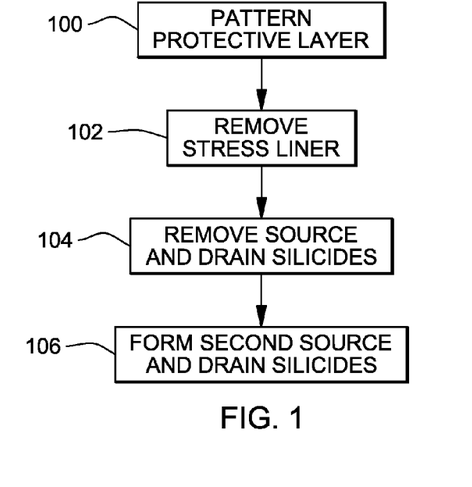
FIG. 1 is a flow diagram illustrating one exemplary method embodiment herein.

FIG. 1 is a flow diagram illustrating an exemplary method embodiment herein that alters an integrated circuit structure. The integrated circuit structure comprises at least one first-type field effect transistor and at least one second-type field effect transistor. The first-type field effect transistor and the second-type field effect transistor each comprise source and drain regions, a channel region between the source and drain regions, a gate conductor adjacent the channel region, a gate insulator between the channel region and the gate conductor, a first-type silicide layer on the gate conductor and the source and drain regions, and a stress liner on the first-type silicide layer. The first-type silicide layer is thicker in regions over the gate conductor relative to regions over the source and drain regions.

As shown in item 100 in FIG. 1, the method patterns a protective layer over the first-type field effect transistor and, in item 102, removes the stress liner from above the second-type field effect transistors. Next, in item 104, the method removes the first-type silicide layer from the source and drain regions of the second-type field effect transistor, but can optionally leave at least a portion of the first-type silicide layer on the gate conductor of the second-type field effect transistor. Thus, the embodiments herein provide the engineer the option to completely remove the first-type silicide layer from the gate conductor of the second-type field effect transistor or to leave a portion of the first-type silicide layer on the gate conductor of the second-type field effect transistor. This option allows the engineer to have different impurities diffuse into the gate conductor of the second-type field effect transistor if a different type impurity (such as metals) is utilized in the second-type silicide layer.

The process of removing the first-type silicide layer in item 104 can leave some of the first-type silicide layer or can remove all of the first-type silicide layer from the source and drain regions of the second-type field effect transistor. For example, the material removal process can be continued until recesses are formed in the source and drain regions of the second-type field effect transistor. However, the material removal process is limited so that the thicker first-type silicide region over the gate conductor is never fully removed so that the gate conductor is not affected by the process that removes the silicide from the source and drain regions.

In item 106, the method then forms a second-type silicide layer on the gate conductor and the source and drain regions of the second-type field effect transistor. The second-type silicide layer that is formed in item 106 is different than the first-type silicide layer. For example, the first-type silicide layer and the second-type silicide layer can comprise different materials, different thicknesses, different crystal orientations, and/or different chemical phases, etc.

Optionally, the first-type silicide layer can be tuned to be thicker in regions over the gate conductor relative to regions over the source and drain regions by adjusting spacer pull-down. Removing the silicide on the gate will work with recessed source/drain regions, where new silicide is also formed on the gate. The silicide on the second gate can be either thinner or thicker than the first gate.

This method is also illustrated schematically in FIGS. 2-10. As mentioned above, the method embodiments herein alter an integrated circuit structure that is well-known to those ordinarily skilled in the art. More specifically, field effect transistors and the methods and materials required to make such structures are well-known to those ordinarily skilled in the art as evidenced by, for example, U.S. Pat. Nos. 7,479,684; 7,355,253; and 7,247,547 (which are incorporated herein by reference) and therefore a detailed discussion of such structures is not provided here so as to allow the reader to focus on the salient aspects of the present embodiments.

Figure 2:
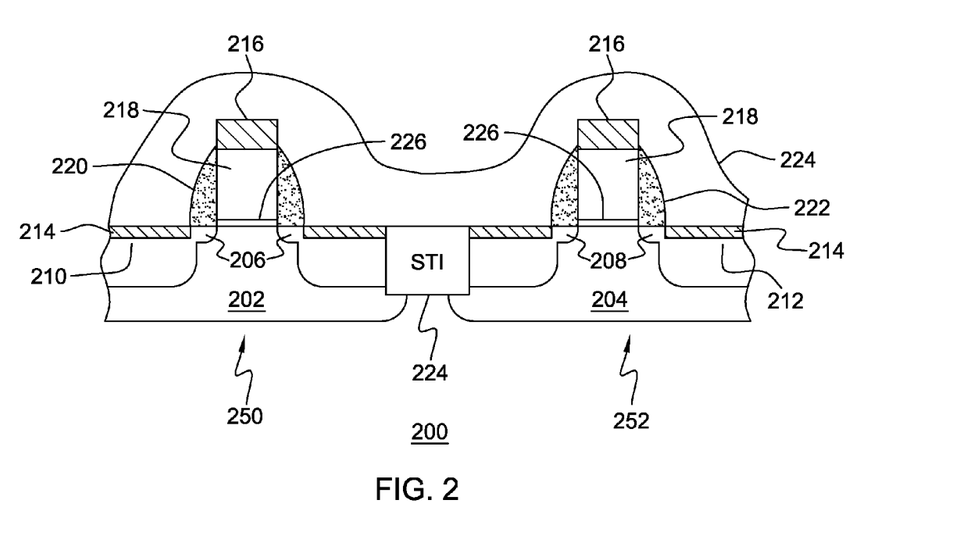
FIG. 2 is a schematic cross-sectional diagram of an integrated circuit structure according to embodiments herein.

Generally, such transistor structures are formed by depositing or implanting impurities into a substrate 200 to form at least one semiconductor channel region 202, 204 bordered (separated) by shallow trench isolation regions 228 below the upper surface of the substrate 200, as shown in FIG. 2. The substrate 200 can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures etc. The impurities can comprises any negative-type impurity (N-type impurity, e.g., phosphorus (P), arsenic (As), antimony (Sb) etc.) or any positive-type impurity (P-type impurity, e.g., boron, indium, etc.). The different channel regions 202, 204 are doped differently depending upon whether the transistor will be a positive-type or a negative-type transistor. As illustrated in FIG. 2, the transistors 250, 252 are complimentary to each other and are therefore opposite type polarity transistors.

The implantation processes mentioned herein can take any appropriate form (whether now known or developed in the future) and can comprise, for example, ion implantation, etc. Also see U.S. Pat. No. 6,815,317 (incorporated herein by reference) for a full discussion of implantation techniques. Shallow trench isolation (STI) structures are well-known to those ordinarily skilled in the art and are generally formed by patterning openings within the substrate and growing were filling the openings with a highly insulating material.

The method forms a gate dielectric 226 on the upper surface of the substrate 200 over the semiconductor channel region 202, 204 and patterns a gate conductor 218 on the gate dielectric 226 over the semiconductor channel region 202, 204 as shown in FIG. 2. The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide, hafnium oxide, zirconium oxide, etc. The thickness of dielectrics herein may vary contingent upon the required device performance.

As shown in FIG. 2, the gate conductor 218 has sidewalls. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

Figure 3:
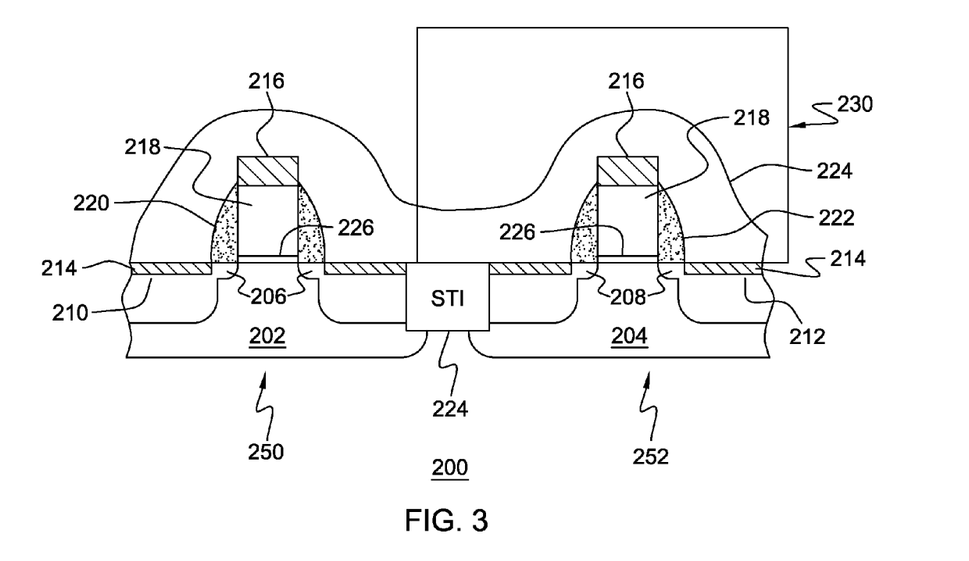
FIG. 3 is a schematic cross-sectional diagram of an integrated circuit structure according to embodiments herein.

As shown in FIG. 2, the method forms sidewall spacers 220, 222 on the sidewalls of the gate conductor 218 (FIG. 3).

Sidewall spacers are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Using the sidewall spacers 220, 222 as an alignment feature, any of the impurities mentioned above are implanted into the substrate to form the source and drain regions 210, 212 and source and drain extensions 206, 208. Again, the different transistors 250, 252 will utilizes different polarity dopants depending upon the polarity of the transistor for the source and drain regions.

The exposed portions of the silicon are then silicided by depositing a metal (such as, tungsten, hafnium, tantalum, molybdenum, titanium, nickel, platinum, alloys of such metals, such as nickel alloys (Pt, Se, Pd) etc.) and then heating the structure in a thermal annealing process. This produces silicides 214 on the source and drain regions and silicides 216 on the gate conductors 218. Note that the silicides 216 on the gate conductors 218 are generally thicker than the silicides 214 on the source and drain regions 210, 212. Finally, the stressing layer 224 is formed over the structure and cured. The stressing layer 224 can be also be stressed as it is deposited. When the stressing layer 224 cures, its size changes which produces either compressive or tensile stress within the channel regions 202, 204 to increase the performance of the channel regions 202, 204.

Thus, the completed transistor structures shown in FIG. 2, comprise at least one first-type field effect transistor 252 and at least one second-type field effect transistor 250. The first-type field effect transistor 252 and the second-type field effect transistor 250 each comprise source and drain regions 210, 212, a channel region between the source and drain regions 202, 204, a gate conductor 218 adjacent the channel region 202, 204, a gate insulator 226 between the channel region 202, 204 and the gate conductor 218, a first-type silicide layer 214 on the gate conductor and the source and drain regions, and a stress liner on the first-type silicide layer 214. The first-type silicide layer 216 is thicker in regions over the gate conductor 218 relative to regions 214 over the source and drain regions 210, 212. While only one of each type of transistor is illustrated in FIG. 2, those ordinarily skilled in the art would understand that many of each type of transistor could be formed on the substrate 200 and the drawings are intended to show multiple ones of each of the different types of transistors; however, the drawings have been simplified to only show a single transistor of each type for clarity and to allow the reader to more easily recognize the different features illustrated. This is not intended to limit the invention because, as would be understood by those ordinarily skilled in the art, the invention is applicable to structures that include many of each type of transistor.

As shown in FIG. 3, the method patterns a protective layer 230 over the first-type field effect transistor 252. The protective layer 230 can comprise any form of commonly available masking material, such as an organic photoresist. As is well known to those ordinarily skilled in the art, such masks are generally exposed to a light source (which changes their reaction to a developer) and rinsed with a developer to form a protective pattern. In this example, the protective pattern remains over the first-type transistor 252 and exposes the second-type transistor 250. Note that in the drawings, the protective layer 230 is shown in somewhat transparent form to allow the underlying features to remain visible in the drawings.

Figure 4:
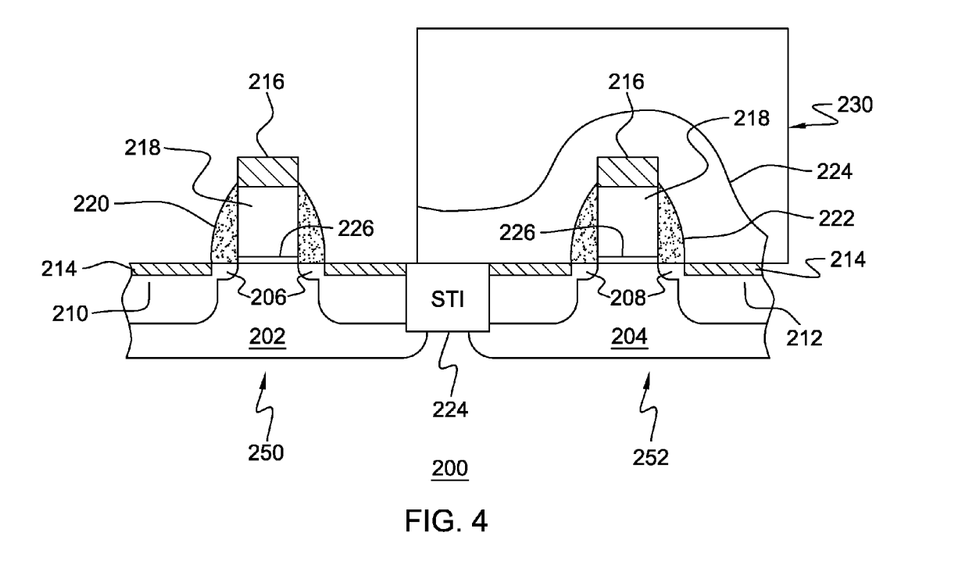
FIG. 4 is a schematic cross-sectional diagram of an integrated circuit structure according to embodiments herein.

As shown in FIG. 4, the method then removes the stress liner 224 from above the second-type field effect transistor 250 using any conventionally known material removal process, such as etching. The various etching and material removal processes mentioned herein can comprise, for example, dry etching with a plasma of reactive gases such as fluorocarbons, oxygen, chlorine, boron trichloride; sometimes with addition of nitrogen, argon, helium and other gases; or wet etching (e.g., a buffered oxide etch, also known as buffered HF or BHF, using a mixture of a buffering agent, such as ammonium fluoride (NH4F), and hydrofluoric acid (HF).

Figure 5:
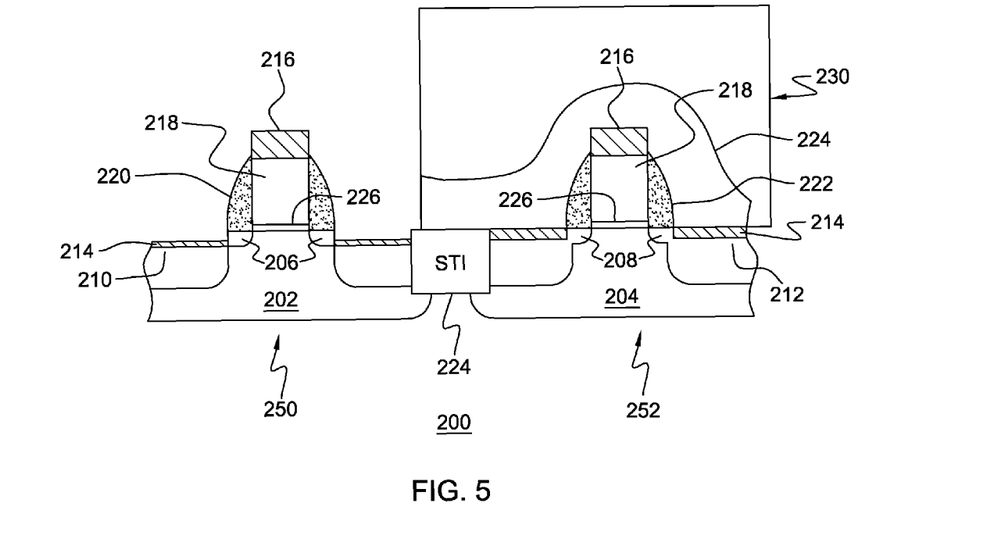
FIG. 5 is a schematic cross-sectional diagram of an integrated circuit structure according to embodiments herein.

Then, as shown in FIG. 5, the method removes a portion of the first-type silicide layer 214 from the source and drain regions of the second-type field effect transistor 250 using any of the previously mentioned material removal processes. This material removal process is controlled (through time controls, power controls, chemical reagent controls, etc.) so that it leaves at least a portion of the first-type silicide layer 214 on the gate conductor 218 and source and drain regions 210 of the second-type field effect transistor 250. Further, while the sidewall spacers 220 may be somewhat reduced in size, the material removal process is controlled so that at least a portion of the spacers 220 remain, so that the gate conductor 218 is not affected. Thus, for example, if reactive ion etching (RIE) is utilized as the material removal process, the spacers 220 are reduced in width. This reduction in spacer 220 width enables the silicide regions 260 to have a closer proximity to the channel region 202 in the second transistor 250 when compared to the spacing of the silicide regions 214 to the channel region 204 of the first transistor 252. By placing the silicide regions 260 closer to the channel region 202, this provides a stress benefit for NFETs, for example, since silicide exerts a tensile strain force.

Figure 6:
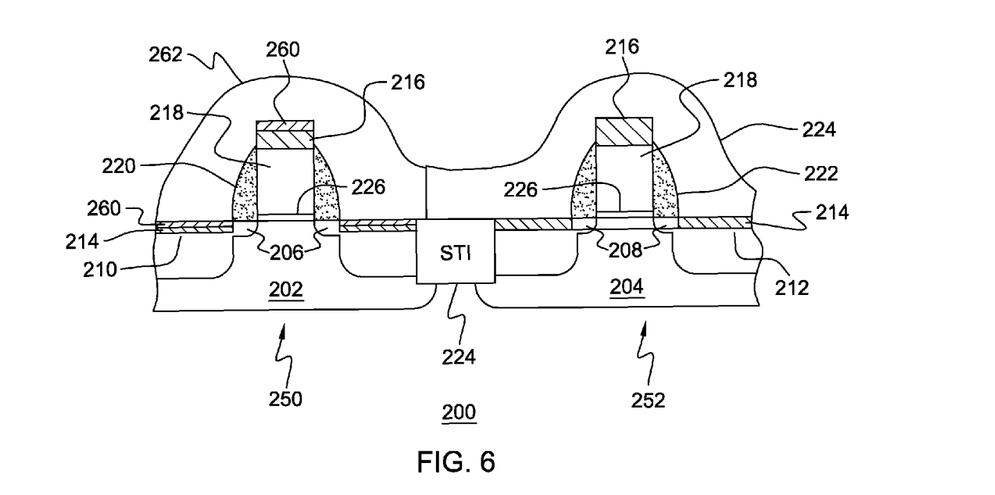
FIG. 6 is a schematic cross-sectional diagram of an integrated circuit structure according to embodiments herein.

As shown in FIG. 6, the method then forms a second-type silicide layer 260 on the gate conductor 218 and the source and drain regions of the second-type field effect transistor 250. The second-type silicide layer 260 that is formed is different than the first-type silicide layer 214. For example, the first-type silicide layer 214 and the second-type silicide layer 260 can comprise different materials, different thicknesses, different crystal orientations, and/or different chemical phases, etc. For example, the second-type silicide layer 260 can comprise a second material (i.e. like Ni) that diffuses much more readily than the first-type silicide layer would diffuse, and that would move through and alter the second gate conductor 218 of the second transistor 250.

The formation of the second-type silicide layer 260 will actually occur through the first-type silicide layer 214, and therefore, the first-type silicide layer 214 must be thinned to an extent to allow silicide growth to occur through the first-type silicide layer.

Next, as also shown in FIG. 6, the protective layer 230 is removed and a second stress liner 262 is formed over the second-type transistor 250. The second stress liner 262 can be identical to the first stress liner 224 or can be different. Therefore, the different stress liners can comprise "dual stress liners." For example, one type of stress liner could be compressive and the other could be tensile. Alternatively, the different stress liners could both be compressive or both be tensile, but have different stress strengths. Further, one of the stress liners could be neutral while the other stress liner is compressive or tensile.

Figure 7:
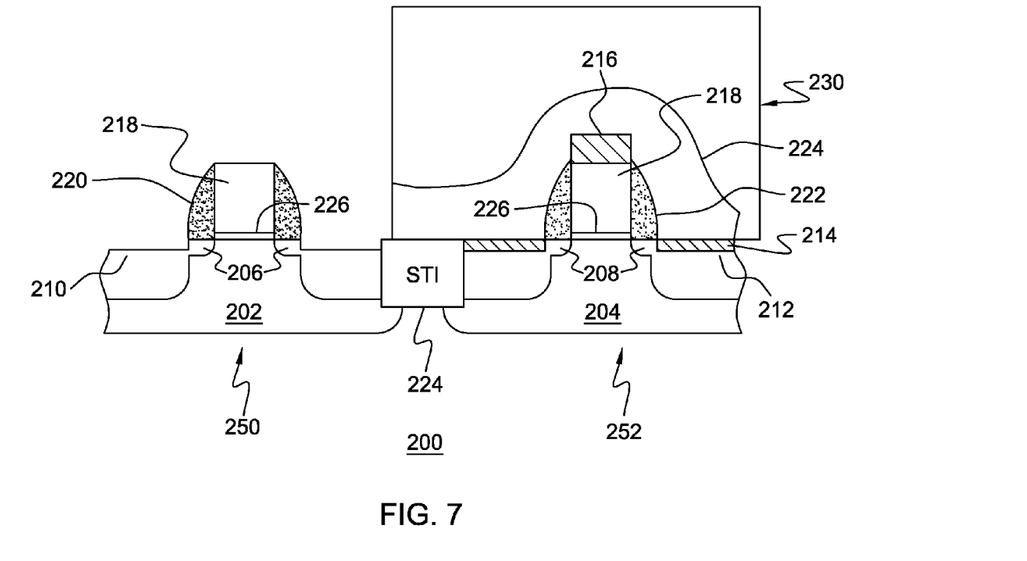
FIG. 7 is a schematic cross-sectional diagram of an integrated circuit structure according to embodiments herein.

FIG. 7 illustrates another embodiment which is the same as the previous embodiment up to the processing shown in FIG. 5; however, in FIG. 7, the first-type silicide layer 214 on the source and drain regions 210 of the second-type field effect transistor 250 is completely removed. Because the first-type silicide layer 216 is thicker over the gate conductor 218, the process of completely removing the first-type silicide layer 214 from the source and drain regions of the second-type field effect transistor 250 does not remove the first-type silicide layer 216 from the gate conductor 218. Alternatively, if desired, the first-type silicide layer 216 can be completely removed from the gate conductor 218 (as illustrated in FIG. 7).

Figure 8:
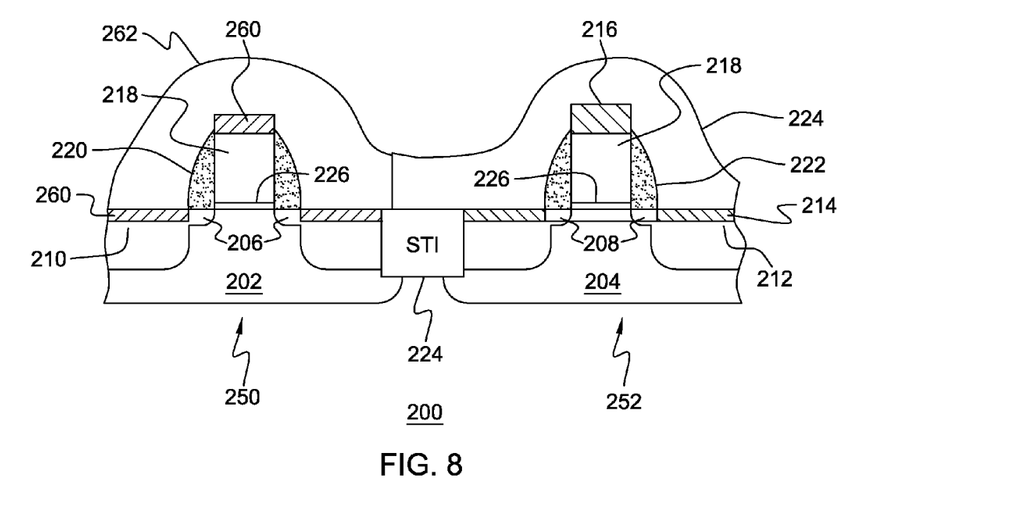
FIG. 8 is a schematic cross-sectional diagram of an integrated circuit structure according to embodiments herein.

Then, as shown in FIG. 8, in a similar manner to that discussed above with respect to FIG. 6, the method then forms the second-type silicide layer 260 on the gate conductor 218 and the source and drain regions 210 of the second-type field effect transistor 250. Again, the second-type silicide layer 260 that is formed is different than the first-type silicide layer 214. Similarly, the protective layer 230 is removed and a second stress liner 262 is formed over the second-type transistor 250.

Figure 9:
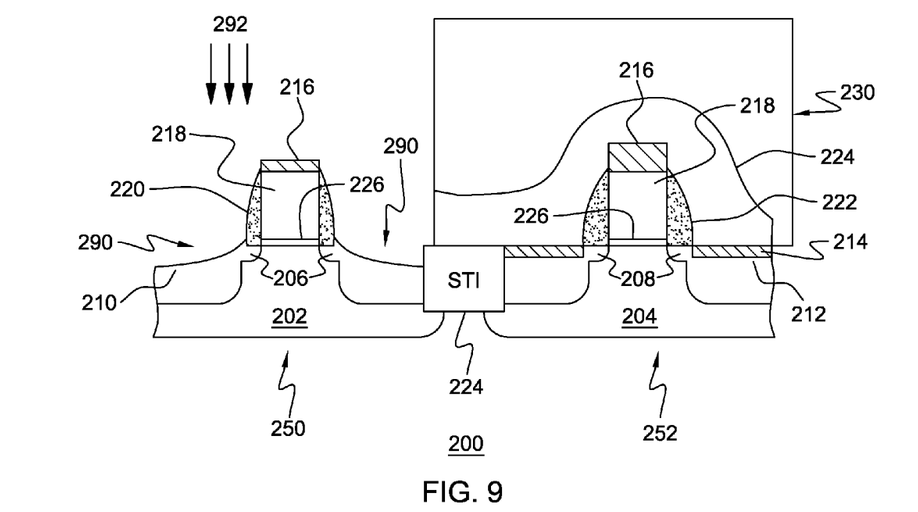
FIG. 9 is a schematic cross-sectional diagram of an integrated circuit structure according to embodiments herein.
Figure 10:
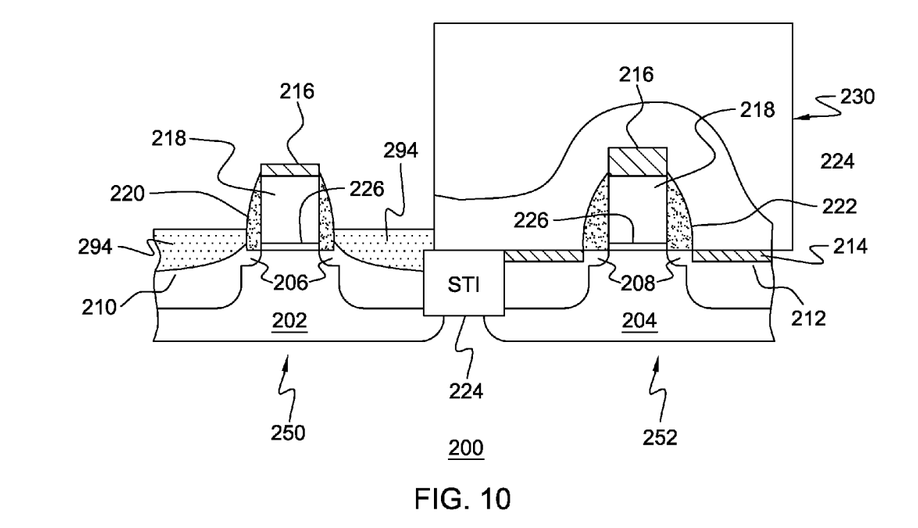
FIG. 10 is a schematic cross-sectional diagram of an integrated circuit structure according to embodiments herein.

FIG. 9 illustrates another embodiment which is the same as the previous embodiments up to the processing shown in FIG. 5; however, in FIG. 9, the material removal process is continued until recesses 290 are formed into the source and drain regions 210. Note that this process is controlled (as described above) so that the silicide 216 can be completely removed from the top of the gate conductor 218 or can remain on the top of the gate conductor 218. As shown in FIG. 9, if desired, additional impurity implants 292 can be performed to alter the impurities within the source and drain regions 202 and provide other effects. Alternatively, in FIG. 10, additional source and drain material 294 can be grown in, for example, an epitaxial silicon process (Si—C or Si—Ge).

Figure 11:
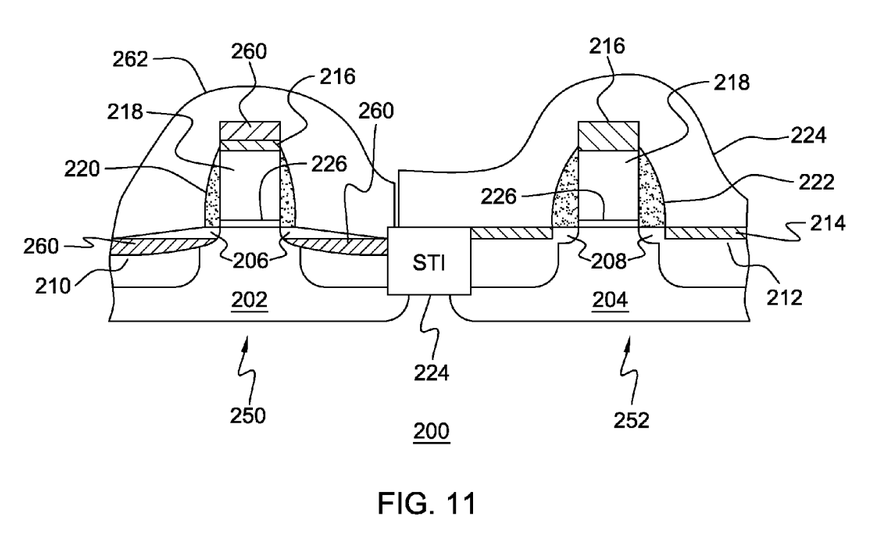
FIG. 11 is a schematic cross-sectional diagram of an integrated circuit structure according to embodiments herein.

Then, as shown in FIG. 11, in a similar manner to that discussed above with respect to FIGS. 6 and 8, the method then forms the second-type silicide layer 260 on the gate conductor 218 and the source and drain regions 210 of the second-type field effect transistor 250. Again, the second-type silicide layer 260 that is formed is different than the first-type silicide layer 214. Similarly, the protective layer 230 is removed and a second stress liner 262 is formed over the second-type transistor 250.

The method embodiments herein produce various integrated circuit structures. One exemplary integrated circuit structure according to embodiments herein is illustrated in FIG. 6 and comprises a substrate 200, at least one first-type field effect transistor 252 partially within the substrate 200 and at least one second-type field effect transistor 250 partially within the substrate 200. The first-type field effect transistor 252 comprises an opposite polarity transistor relative to the second-type field effect transistor 250. Stress liners 224, 262 are positioned on the first-type transistor and the second-type transistor.

The first-type field effect transistor 252 comprises first-type source and drain regions 212 within the substrate 200, a first-type channel region 204 within the substrate 200 between the first-type source and drain regions 212, a first-type gate conductor 218 adjacent the first-type channel region 204, a first-type gate insulator 226 between the first-type channel region 204 and the first-type gate conductor 218, and a first-type silicide layer 214 on the first-type source and drain regions 212.

The second-type field effect transistor 250 comprises second-type source and drain regions 210 within the substrate 200, a second-type channel region 202 within the substrate 200 between the second-type source and drain regions 210, a second-type gate conductor 218 adjacent the second-type channel region 202, and a second-type gate insulator 226 between the second-type channel region and the second-type gate conductor 218, and a second-type silicide layer 260 on the second-type source and drain regions 210. As would be understood by those ordinarily skilled in the art, the gate insulator 226, gate conductor 218 and spacers 220 to 222 could be identical or formed of identical materials.

The first-type silicide layer 214 is different than the second-type silicide layer 260. The first-type silicide layer 214 and the second-type silicide layer 260 can comprise, for example, different materials, different thicknesses (as shown in FIGS. 8 and 11) different crystal orientations, different work functions, and/or different chemical phases, etc. Further, for example, the first-type source and drain regions could be positioned at a different depth within the substrate 200 relative to the second-type source and drain regions, as shown in FIG. 11. If there is any epitaxial growth after the recessing and before the second silicide, the structure can comprise elevated source and drain regions. Alternatively, the first-type silicide layer 214 could be positioned at a first distance from the first-type channel region, and the second-type silicide layer 260 could be positioned at a second distance from the second-type channel region, where the first distance is different than the second distance (as shown in FIG. 11 where the second-type silicide layer 260 is closer to the channel region 202 than is the first-type silicide layer 214). The second-type silicide layer 260 is positioned closer to the second-type channel region in part because the spacers 220 are relatively more narrow than the spacers 222.

With embodiments herein, opposite polarity transistors are produced with dual thickness silicides, dual material (e.g. different alloy concentration) silicides, and differential source and drain recesses, differential silicide proximity to the channel region. Further, with embodiments herein, the silicides can be of different phase even if the silicides utilized the same elements (e.g., NiSi vs. NiSi$_2$). Thus, as shown above, embodiments herein begin with a fully formed a transistor and remove the as-formed silicide from one type of transistor. Silicide re-formation is performed after complete or partial removal of the existing silicide, with the potential for different silicide thickness, material, work function, stresses, etc. The second silicide formation step is performed after the stress liner removal and the silicide re-formation can be performed through an existing thin layer of silicide. Further, embodiments herein provide the possibility of alternative dopant or epitaxial growth on the opened area before re-silicidation.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

The invention claimed is:

1. A method of altering an integrated circuit structure, said method comprising:
   supplying an integrated circuit structure comprising at least one first-type field effect transistor and at least one second-type field effect transistor, said first-type field effect transistor and said second-type field effect transistor each comprising source and drain regions, a channel region between said source and drain regions, a gate conductor adjacent said channel region, a gate insulator between said channel region and said gate conductor, and a first-type silicide layer on said gate conductor and said source and drain regions;
   patterning a protective layer over said first-type field effect transistor;
   removing at least a portion of said first-type silicide layer from said second-type field effect transistor; and
   forming a second-type silicide layer on said gate conductor and said source and drain regions of said second-type field effect transistor, said second-type silicide layer being different than said first-type silicide layer.

2. The method according to claim 1, said first-type silicide layer and said second-type silicide layer comprising at least one of: different materials; different thicknesses; different crystal orientations; and different chemical phases.

3. The method according to claim 1, said first-type field effect transistor and said second-type field effect transistor each comprising a stress liner on said first-type silicide layer, said method further comprising, after said patterning of said protective layer, removing said stress liner from above said second-type field effect transistors.

4. The method according to claim 1, said removing of said portion of said first-type silicide layer comprising removing all of said first-type silicide layer.

5. The method according to claim 1, said removing of said portion of said first-type silicide layer being continued until recesses are formed in said source and drain regions of said second-type field effect transistor.

6. A method of altering an integrated circuit structure, said method comprising:
   supplying an integrated circuit structure comprising at least one first-type field effect transistor and at least one second-type field effect transistor, said first-type field effect transistor and said second-type field effect transistor each comprising source and drain regions, a channel region between said source and drain regions, a gate conductor adjacent said channel region, a gate insulator between said channel region and said gate conductor, and a first-type silicide layer on said gate conductor and said source and drain regions, said first-type silicide layer being thicker in regions over said gate conductor relative to regions over said source and drain regions;
   patterning a protective layer over said first-type field effect transistor;
   removing said first-type silicide layer from said source and drain regions of said second-type field effect transistor and leaving at least a portion of said first-type silicide layer on said gate conductor of said second-type field effect transistor; and
   forming a second-type silicide layer on said gate conductor and said source and drain regions of said second-type field effect transistor, said second-type silicide layer being different than said first-type silicide layer.

7. The method according to claim 6, said first-type silicide layer and said second-type silicide layer comprising at least one of: different materials; different thicknesses; different crystal orientations; and different chemical phases.

8. The method according to claim 6, said first-type field effect transistor and said second-type field effect transistor each comprising a stress liner on said first-type silicide layer, said method further comprising, after said patterning of said protective layer, removing said stress liner from above said second-type field effect transistors.

9. The method according to claim 6, said removing of said portion of said first-type silicide layer comprising removing all of said first-type silicide layer.

10. The method according to claim 6, said removing of said portion of said first-type silicide layer being continued until recesses are formed in said source and drain regions of said second-type field effect transistor.

11. A method of altering an integrated circuit structure, said method comprising:
    supplying an integrated circuit structure comprising at least one first-type field effect transistor and at least one second-type field effect transistor separated by a shallow trench isolation region positioned between said first-type field effect transistor and said second-type field effect transistor, said first-type field effect transistor and said second-type field effect transistor each comprising source and drain regions, a channel region between said source and drain regions, a gate conductor adjacent said channel region, a gate insulator between said channel region and said gate conductor, and a first-type silicide layer on said gate conductor and said source and drain regions;
    patterning a protective layer over said first-type field effect transistor;
    removing at least a portion of said first-type silicide layer from said second-type field effect transistor; and
    forming a second-type silicide layer on said gate conductor and said source and drain regions of said second-type field effect transistor in a manner that said first-type silicide layer is positioned at a first distance from a center of said first-type channel region, said second-type silicide layer is positioned at a second distance from a center of said second-type channel region, said first distance being different than said second distance, and said second-type silicide layer being different than said first-type silicide layer.

12. The method according to claim 11, said first-type silicide layer and said second-type silicide layer comprising at least one of: different materials; different thicknesses; different crystal orientations; and different chemical phases.

13. The method according to claim 11, said first-type field effect transistor and said second-type field effect transistor each comprising a stress liner on said first-type silicide layer, said method further comprising, after said patterning of said protective layer, removing said stress liner from above said second-type field effect transistors.

14. The method according to claim 11, said removing of said portion of said first-type silicide layer comprising removing all of said first-type silicide layer.

15. The method according to claim 11, said removing of said portion of said first-type silicide layer being continued until recesses are formed in said source and drain regions of said second-type field effect transistor.

* * * * *